United States Patent [19]
Yamazaki

[11] Patent Number: 4,910,508
[45] Date of Patent: Mar. 20, 1990

[54] MATRIX LOGIC CIRCUIT NETWORK SUITABLE FOR LARGE-SCALE INTEGRATION

[75] Inventor: Isamu Yamazaki, Kawasaki, Japan

[73] Assignee: Tokyo Shibaura Denki Kabushiki Kaisha, Kawasaki, Japan

[21] Appl. No.: 808,377

[22] Filed: Dec. 16, 1985

Related U.S. Application Data

[63] Continuation of Ser. No. 465,465, Feb. 10, 1983, abandoned.

[30] Foreign Application Priority Data

Feb. 17, 1982 [JP] Japan .................. 57-24116

[51] Int. Cl.⁴ .......................... H04Q 1/02; H04Q 3/00
[52] U.S. Cl. ................... 340/825.9; 307/465; 307/468; 340/825.91
[58] Field of Search .............. 307/465, 468; 340/825.79, 825.8–825.91

[56] References Cited

U.S. PATENT DOCUMENTS 3,816,725  6/1974  Greer .................. 307/468

Primary Examiner—Ulysses Weldon
Attorney, Agent, or Firm—Oblon, Spivak, McClelland, Maier & Neustadt

[57] ABSTRACT

A matrix logic circuit network comprises a great number of interconnected logic gates. Input and output lines of the logic gates are arranged in the matrix array. By rearranging the input and output lines of the matrix in accordance with a sort algorithm, direct connection points of the input and output lines to which the same signals are allotted and connecting elements forming logic gates located at given intersections of the input and output lines are arranged within a diagonal area with a limited width, which extends along a diagonal line of the matrix.

8 Claims, 11 Drawing Sheets

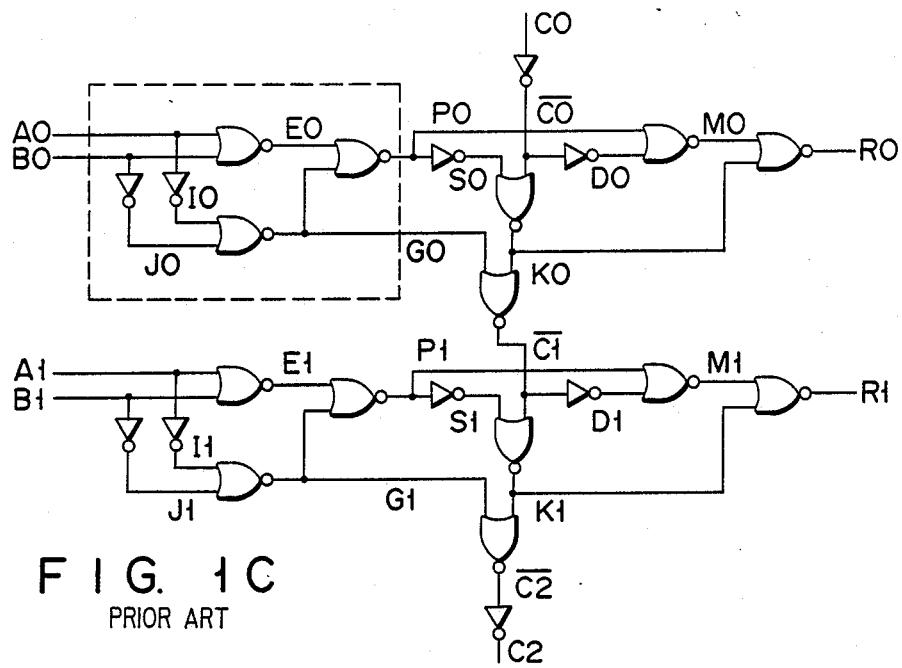
FIG. 1C
PRIOR ART
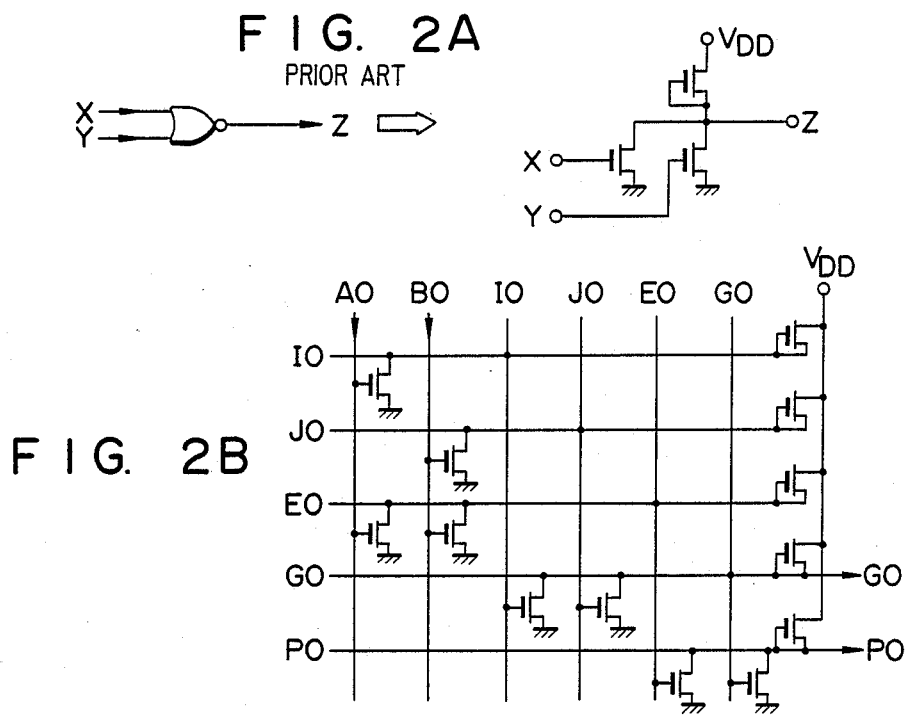
FIG. 2A
PRIOR ART
FIG. 2B

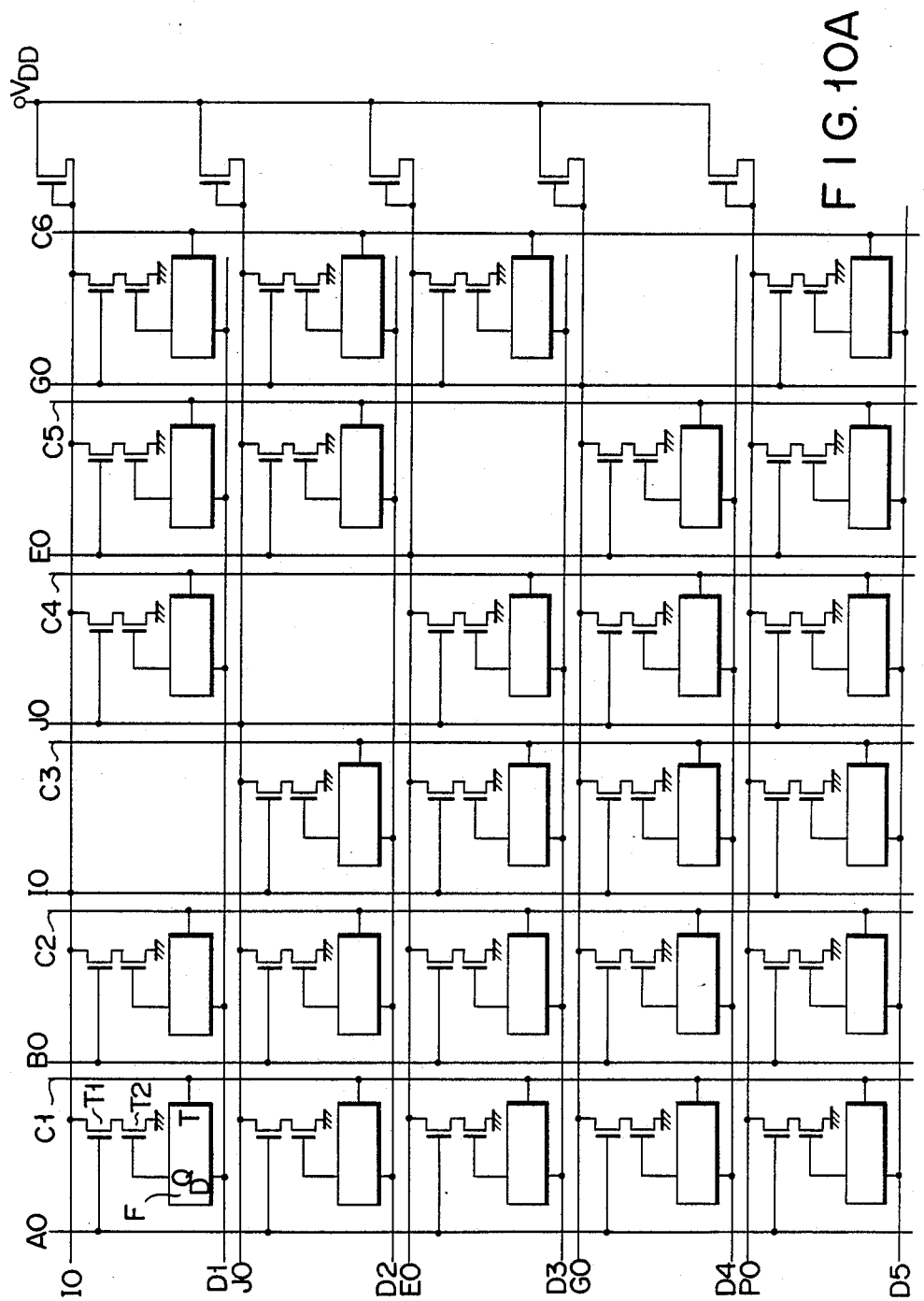

MATRIX LOGIC CIRCUIT NETWORK SUITABLE FOR LARGE-SCALE INTEGRATION

This application is a continuation, of application Ser. No. 465,465, filed Feb. 10, 1983 now abandoned.

BACKGROUND OF THE INVENTION

This invention relates to a matrix logic circuit network which occupies a small area, and is suitable for large-scale integration.

With recent advances in integrated-circuit manufacturing techniques, a large-scale logic circuit network can be realized in one chip. However, the large-scale version of the logic circuit network makes it difficult to design and requires a long time for its development. In particular, custom-made LSIs, which require the specific design of IC patterns for every application, encounter technical difficulties in the automatic design with the aid of a computer, because a variety of circuit network patterns are required. For this reason, the design of such LSI's must resort largely to manpower and the development of the custom-made LSI's is most time consuming. To cope with this difficulty, semicustom-made LSI developing techniques such as a building block method, gate array method and the like have been proposed which enable, by limiting the variations of circuit network patterns, the automatic design of circuit network patterns and reduces LSI developing processes.

These methods, however, have a disadvantage that a computer must be used for a long time, since an algorithm for automatic layout and wiring is complicated and the amount of calculations is extremely large.

For solving this problem, another method has been proposed, called a programmable logic array (PLA), in which further limits he layout and wiring of the circuit patterns. With this method, a desired logic circuit is formed by cascading an AND-circuit matrix and an OR-circuit matrix. In the OR matrix, however, the number of transistors which are actually used is very small. This tendency becomes more distinctive as the matrix becomes larger, resulting in poor integration density. In this respect, it was difficult to realize a large system by the PLA.

It is a common practice to perform a software simulation using a computer or a hardware simulation using a breadboard, for checking the function of a designed system.

With all of these conventional methods, however, the computer must be used for a long period of time for the purpose of software simulation and an operation test linked with other devices cannot be performed. For the hardware simulation, the manufacturing and adjustment of the breadboard requires much of time, labor and cost.

SUMMARY OF THE INVENTION

Accordingly, an object of the invention is to provide a matrix logic circuit network which enables the reduction of the occupying area of an effective circuit section and is suitable for large-scale integration.

According to this invention, there is provided a matrix logic circuit network comprising a number of interconnected logic gates, in which input and output lines of the logic gates are arranged in the form of a matrix array, corresponding input and output lines to which the same signal is allotted are directly connected at its intersection, and connecting elements for forming the logic gates are provided, at least in use, at given intersections of the input and output lines, characterized in that the direct connection points of the input and output lines and the connecting elements at the intersections of the input and output lines are arranged, by rearranging the input and output lines according to a sort algorithm, within a diagonal area with a limited width, which extends along a diagonal line of the matrix.

BRIEF DESCRIPTION OF THE DRAWINGS

FIGS. 1A to 1C show logic circuit arrangements of 2-bit adder circuits;

FIG. 2A shows a circuit arrangement of a NOR gate using MOS transistors;

FIG. 2B shows a matrix circuit arrangement enclosed by a dotted line in FIG. 1C;

FIGS. 10A and 10B show an arrangement of a circuit at each intersection of a matrix circuit for forming a diagonal variable logic array.

DETAILED DESCRIPTION OF THE PREFERRED EMBODIMENTS

It is to be understood that the present invention is based on the following facts:

(a) All of logic circuits can be formed by a combination of only NAND gates or only NOR gates.

(b) A logic circuit network having a number of interconnected logic gates with inputs and outputs can be formed in the form of a matrix which includes a rectangular array of intersections of the input lines and output lines of the logic gates.

(c) In the field of numerical calculation, nonzero elements of a sparse matrix in which nonzero elements are sparsely distributed and residual elements are all zero, can be collectively disposed within an area in the vicinity of a diagonal line of the matrix by properly rearranging the rows and columns.

Though a desired logic circuit can be formed by an OR gate(s), AND gate(s) and inverter(s), De Morgan's theorem in Boolean algebra, as expressed by $\overline{A \cdot B} = \overline{A} + \overline{B}; \overline{A + B} = \overline{A} \cdot \overline{B}$, teaches that a desired logic circuit can be formed by an inverter(s) and OR gate(s), or an inverter(s) and AND gate(s). Alternatively, a logic circuit can be realized only by NOR gates. This is because an inverter can be realized as a one-input NOR gate and an OR gate can be realized by cascade connection of a NOR gate and an inverter. Further, a logic circuit can be realize by only NAND gates. A logic gate serving as a NAND gate in the positive logic system serves as a NOR gate in the negative logic system, and vice versa.

This will be described in more detail using an adder circuit.

Figure 1A:
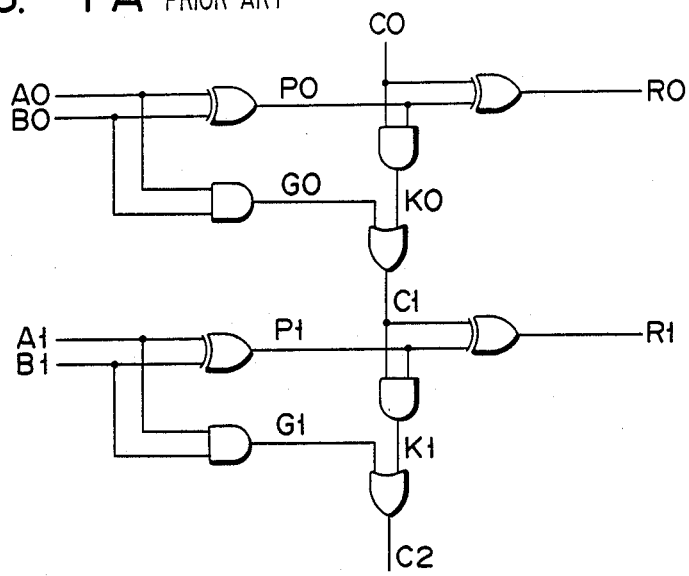
Figure 1B:
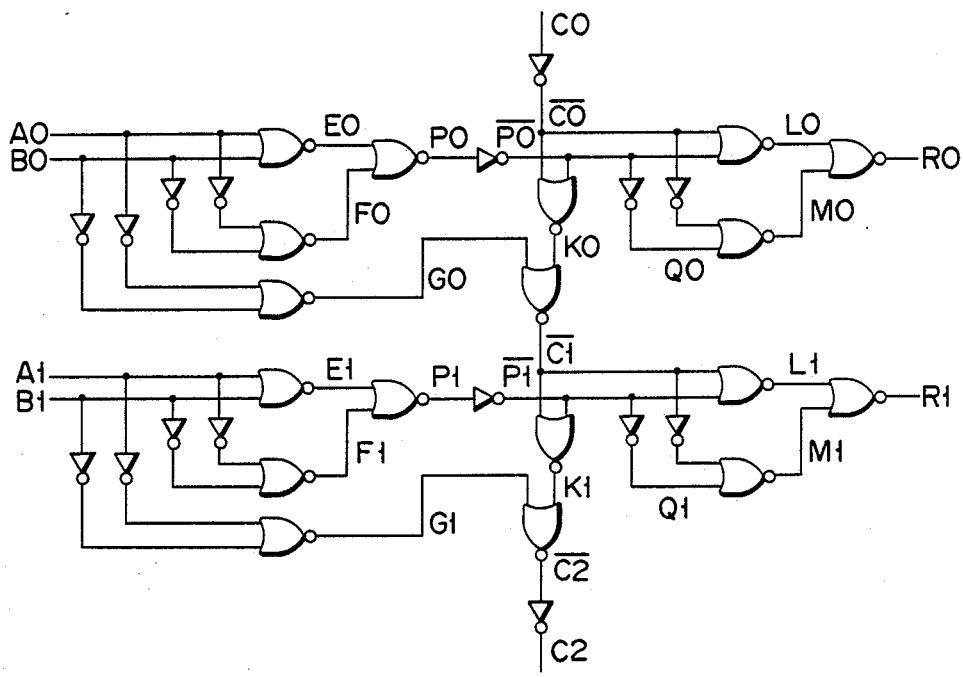

FIGS. 1A to 1C show an adder circuit which receives two bits (A1, A0) and (B1, B0) and a carry bit C0 and produces sum bits (R1, R0) and a carry bit C2. The adder circuit of FIG. 1A is composed of Exclusive OR (EX—OR) gates, AND gates, and OR gates. The adder circuit shown FIG. 1A may be modified into an adder circuit composed of only NOR gates as shown in FIG. 1B. In FIG. 1B, a signal F0 is identical to G0; F1 to G1; P0 to Q0; P1 to Q1; L0 to K0; and L1 to K1. Based on this fact, the number of gates may be reduced as shown in FIG. 1C.

A circuit network having a number of interconnected logic gates with inputs and outputs can be realized in the form of a matrix. Using NOR gates and inverters, which are formed by MOS transistors as shown in FIG. 2A, the circuit section enclosed by a dotted line in FIG. 1C can be represented in such a matrix array as shown in FIG. 2B.

Figure 3A:
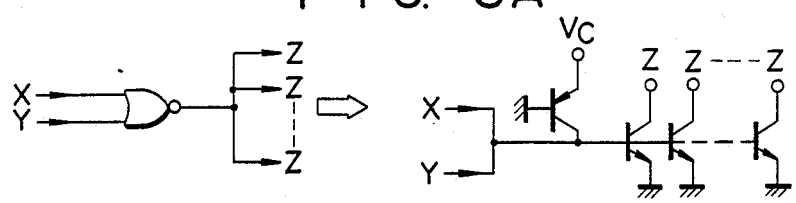
FIG. 3A shows a circuit arrangement of a NOR gate using I²L gates.
Figure 3B:
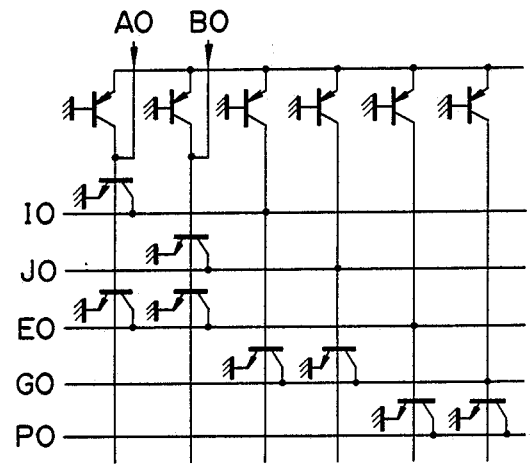
FIG. 3B shows a matrix circuit arrangement of a circuit section enclosed by a dotted line in FIG. 1C using the circuit arrangement of FIG. 3A.

With NOR gates and inverters using I²L (integrated-injection logic) gates as shown in FIG. 3A, the circuit section enclosed by a dotted line in FIG. 1C can be realized by a matrix circuit as shown in FIG. 3B.

Figure 4A:
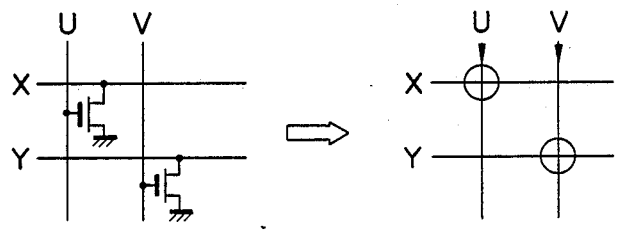
FIG. 4A shows a simplified expression of a matrix circuit arrangement.
Figure 4B:
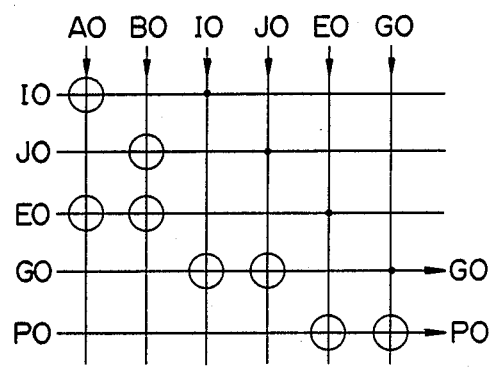
FIG. 4B shows a matrix array of a circuit section enclosed by a dotted line in FIG. 1C using the matrix expression of FIG. 4A.

As seen from FIGS. 2B and 3B, connecting elements such as transistors are provided at given intersections of the matrix, while no elements are provided at the other intersections. A connecting patter of the connecting elements determines the function of a circuit. For using an output of each gate for an input of a succeeding gate, that is to say, feeding an output line back to an input line of the matrix, the corresponding input and output lines to which the same signal is allotted are directly connected to each other at its intersection. Thus, the function of a matrix logic circuit network is determined b the layout pattern of the connecting elements such as transistors and direct connection points of input and output lines. When an intersection of the matrix at which a transistor is provided is denoted by a circle, the matrix circuits shown in FIGS. 2B and 3B can be rewritten as shown in FIG. 4B. The overall circuit arrangement shown in FIG. 1C can be expressed by a matrix as shown in FIG. 4C.

The matrix version of a circuit network is very suitable for LSI fabrication. A first reason for the above is that since circuit network pattern has a regular configuration, the layout of an IC mask pattern becomes easy. A second reason is that since the wiring of the circuit network is regularly arranged, a relatively high density circuit can be realized. When realizing a circuit network by LSI, transistors may be formed at 11 the intersections of input and output lines, and the connection of the transistors to the input or output lines may be determined using a contact hole pattern. Alternatively, transistors may be selectively connected to lines through fusible links when the circuit is put to use. When the transistors are MOS transistors, they may be connected at all the intersections, and selectively made valid or invalid by a mask pattern for specifying the thickness of a gate oxide film of each transistor. According to this method, different circuit may be formed with different mask patterns. Namely, the design modification of the circuit network becomes easy. This is a third reason for the matrix version of the circuit network.

As described above, it is well known that the matrix version of a logic circuit network is useful in LSI fabrication and widely used in the PLA and mask ROM. The matrix array shown in FIG. 4C is essentially different from the conventional PLA and ROM, in that the matrix array includes therein the feedback connections or direct connections of input and output lines.

Figure 4C:
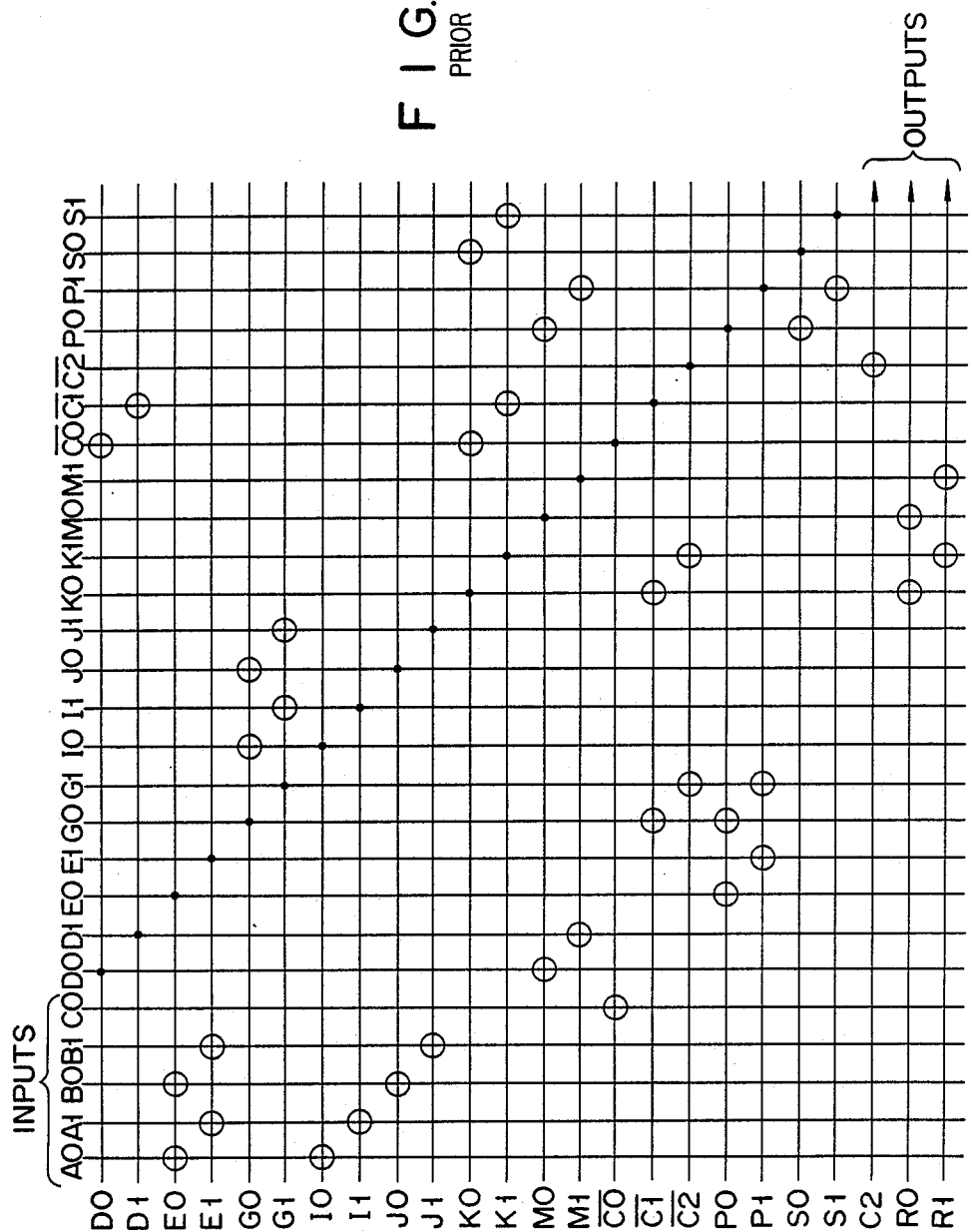
FIG. 4C shows a matrix array of the adder circuit of FIG. 1C using the matrix expression of FIG. 4A.

As seen from FIG. 4C, the density of effective intersections, that is, intersections at which transistors are connected, is very low. This example uses 24 gates. As the number of gates becomes much larger, the density of the effective intersections becomes remarkably lowered. This is because the length of one side of the matrix becomes large in proportion to the number of gates. More specifically, although the number of all the intersections increases in proportion to the square of the number of gates, the fan-in and fan-out per gate are almost fixed, 2 to 3 on the average. Therefore, the number of effective intersections increases depending only on the number of gates. Further, we can find that such gates matrix of input and output lines is similar to the sparse matrix described before, corresponding effective intersections to nonzero elements, and unconnected intersections to zero elements.

According to the present invention, the input lines (columns) and output lines (rows) in a sparse matrix in which effective intersections are sparsely distributed are properly rearranged so that the effective intersections are disposed within a diagonal area extending along a diagonal line of the matrix.

Figure 5:
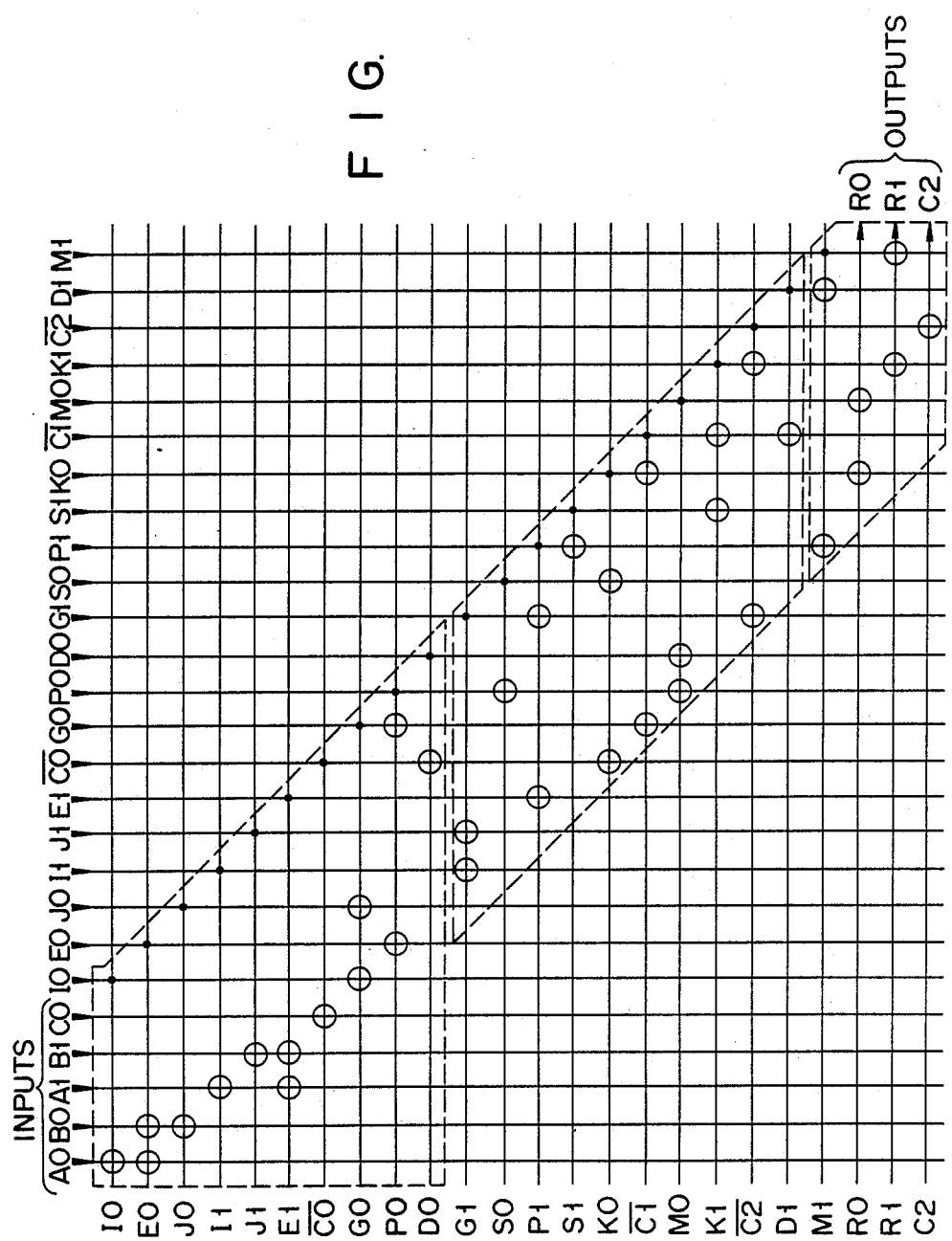
FIG. 5 shows a matrix array obtained by rearranging the input and, output lines of the matrix circuit shown in FIG. 4C, in accordance with this invention.

Algorithms to find the proper rearrangement of rows and columns of a matrix have been studied in the field of numerical calculation. Some typical examples are: the Rosen's method, the Grooms's method, the Colins's method, the Gibbs's method, the Poole's method and the Stockmeyer's method. When the matrix shown in FIG. 4C is rearranged by using any of these algorithms, such an array as shown in FIG. 5 is obtained. In the matrix array of FIG. 4C, the maximum width of a diagonal area extending along a diagonal line is "30", while in the array of FIG. 5, it reduces to "9". As a result, in the FIG. 5 array, the portion outside the diagonal area does not need to be formed in the LSI, so that the density of the effective intersections may be improved.

With such a rearrangement of the matrix, every circuit network is not always possible in collecting the effective intersections within the specific width of the diagonal area. In circuit networks of practical use, however, it has been known by experience that such collection of the effective intersections is possible. From experience the relationship of the width (B) of the diagonal area to the number (G) of gates is given by $$B \simeq 1.18 \times G^{0.62} \qquad \ldots (1)$$

If the effective intersections of a matrix logic circuit cannot be arranged within this area, its circuit arrangement should be modified without changing its function, so that the effective intersections of modified matrix can be arranged within the diagonal area. Particularly when an effective intersection is positioned far away from the diagonal area, two inverters may be inserted in series in a signal path associated with the effective intersection so that the said effective intersection comes near the diagonal area.

Figure 7:
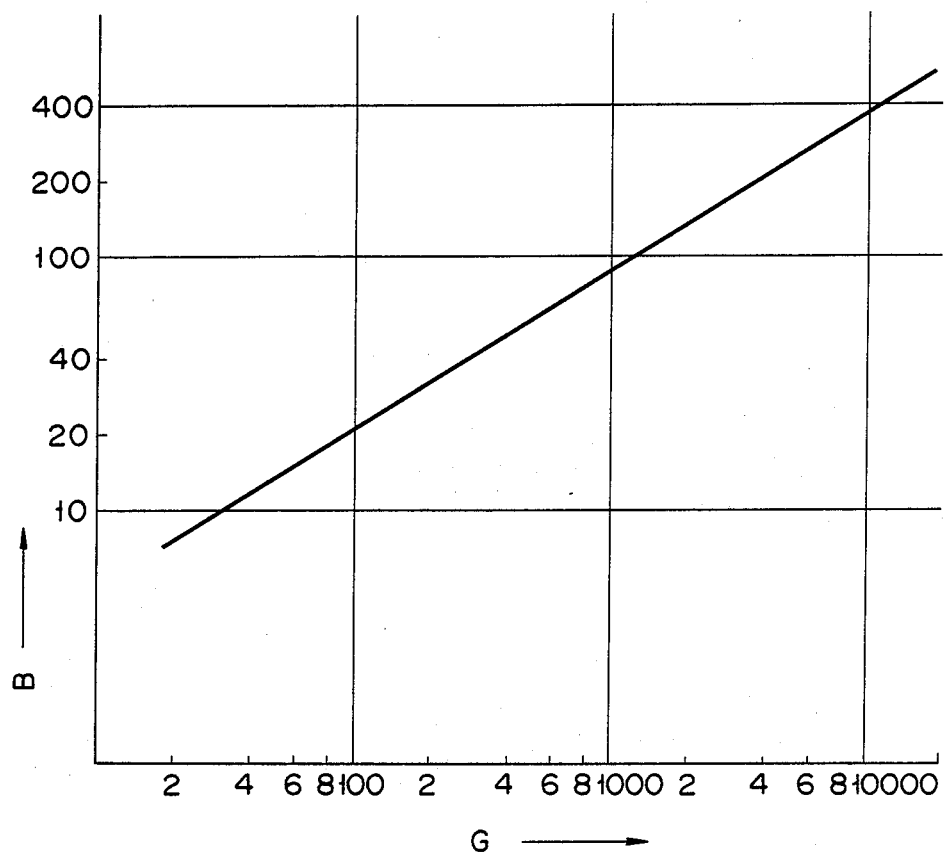
FIG. 7 illustrates a relationship between the number of used gates and the width of the effective diagonal area obtained by rearranging the matrix.

Thus, in the logic circuit networks, the matrix array of effective intersections may always be arranged within the diagonal area with the width B as given by equation (1). FIG. 7 shows a graphic representation of G vs. B relationship as given by equation (1). As seen from FIG. 7, even in the case of an LSI with 10,000 gates, a desired logic circuit may be formed in the diagonal area of 360 intersections.

Figure 8:
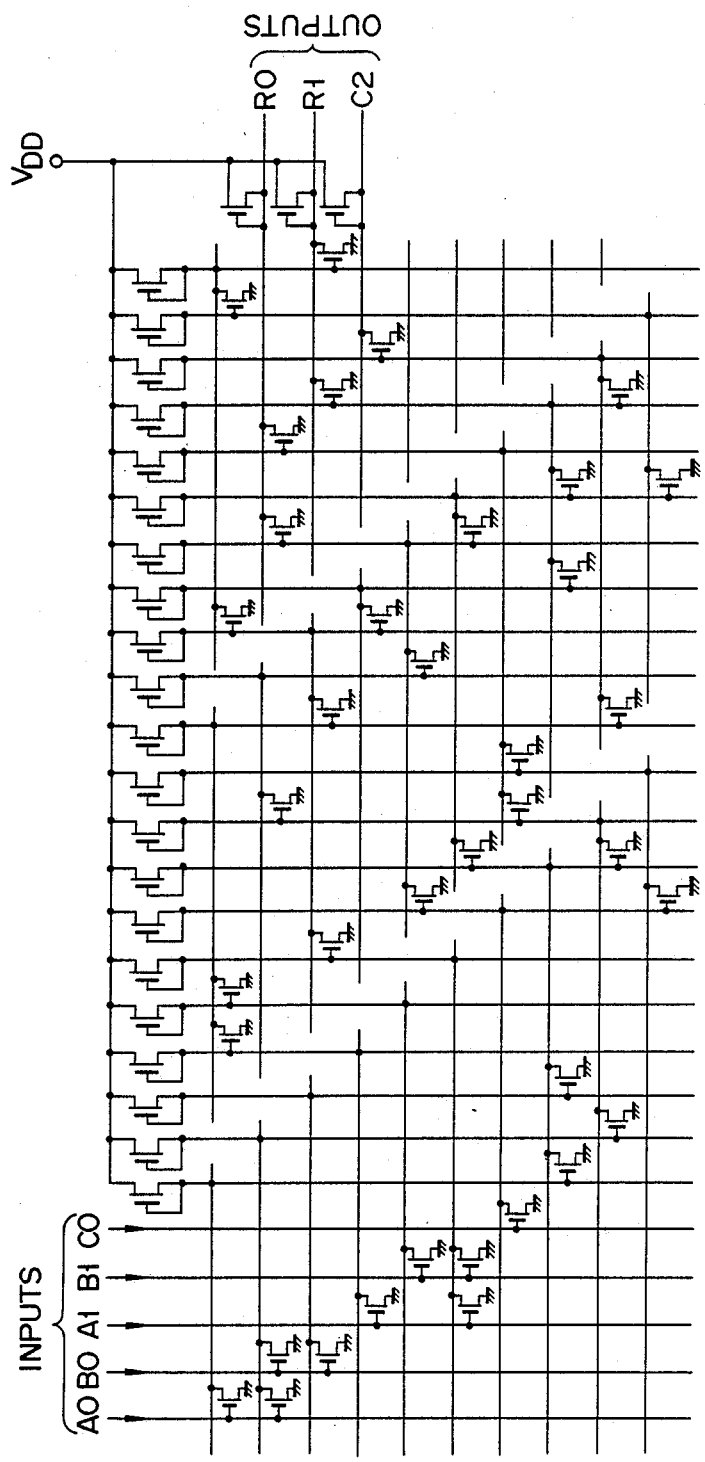
FIG. 8 is a practical circuit arrangement of the matrix array of FIG. 6.

Referring to FIG. 8, there is shown a diagonal logic array formed according to the present invention. The function of this array is the same as that of the two-bit adder shown in FIG. 1A. More specifically, two binary numbers from input terminals A0 and A1 and B0 and B1, and a carry bit from carry terminal C0 are added together, the sum bits are taken from output terminals R0 and R1, and a carry bit is taken from terminal C2. This circuit is formed of NOR gates using MOS transistors. This circuit network has the above-described addition function. It will be understood by showing that this circuit network is equivalent to that of FIG. 5.

Figure 6:
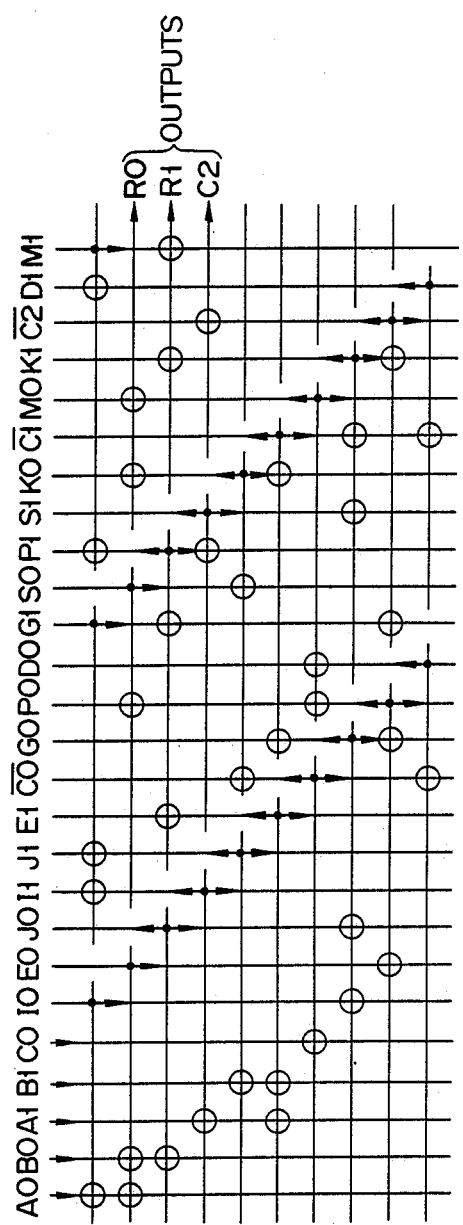
FIG. 6 shows a matrix array which is a modification of the circuit of FIG. 5.

Namely, by dividing the diagonal area of the logic, circuit network of FIG. 5 into three sections in, parallel with output lines, and arranging these three sections side-by-side to overlap with one another with respect to common input lines of the adjacent sections, the logic circuit network of FIG. 5 is modified into the rectangular array as shown in FIG. 6. It is apparent that the array of FIG. 6 is equivalent in function to that of FIG. 5. The array of FIG. 5 may be expressed using MOS transistors as shown in FIG. 8.

As seen from the foregoing description, according to a matrix arranging method of the present invention, large-scale integrated logic circuits having a large number of gates per unit area can be developed within a short period of time. Further, the matrix logic circuit of the present invention allows a software simulation using a computer to be executed more quickly than the conventional general-purpose logic simulation.

A modification of the present invention will now be described. With the typical embodiment of the invention as shown in FIG. 8, no transistors are formed at unnecessary intersections of the matrix array. Alternatively, the circuit network can be designed such that transistors are formed at all the intersections, and at the unnecessary intersections, transistors are not connected to input lines or output lines, or are made inoperable. With this arrangement, when the circuit must be modified, the modification of the circuit pattern of the LSI has only to be made to a minimum extent.

In the matrix array of FIG. 8 the diagonal region is formed to have a width corresponding to only nine rows of the array of FIG. 6. Practically, however, the diagonal region may be formed to have a width of 10 or 11 rows, allowing for a flexibility in the circuit modification.

In the array of FIG. 5, though the direct connection points of input and output lines are aligned with the diagonal line, when the input and output lines ar rearranged independently, these connection points are irregularly arranged. Even with the matrix array having such an irregular arrangement of connection points, if the direct connection points and the effective intersections are arranged within a diagonal area with a fixed width, the modification as shown in FIG. 6 is possible. In the matrix array in FIG. 5, all the effective intersections are located on the lower left side of the direct connection points. It should be understood that the arrangement of the effective intersections is not limited to this arrangement.

If the circuit network has no internal feedback, or if there is no loop of a signal path, all the effective intersections may generally be located on either side of the direct connection points. However, this is not always true when a loop is contained in the signal path. A logic circuit (sequence logic circuit) including a flip-flop has looped signal paths. Therefore, for such a sequence logic circuit, the transistors for effective intersections must be formed on both sides of the direct connection points. When so constructed, the sequence logic circuit may also be fabricated in an LSI by the diagonal matrix circuit network according to the present invention.

Figure 9:
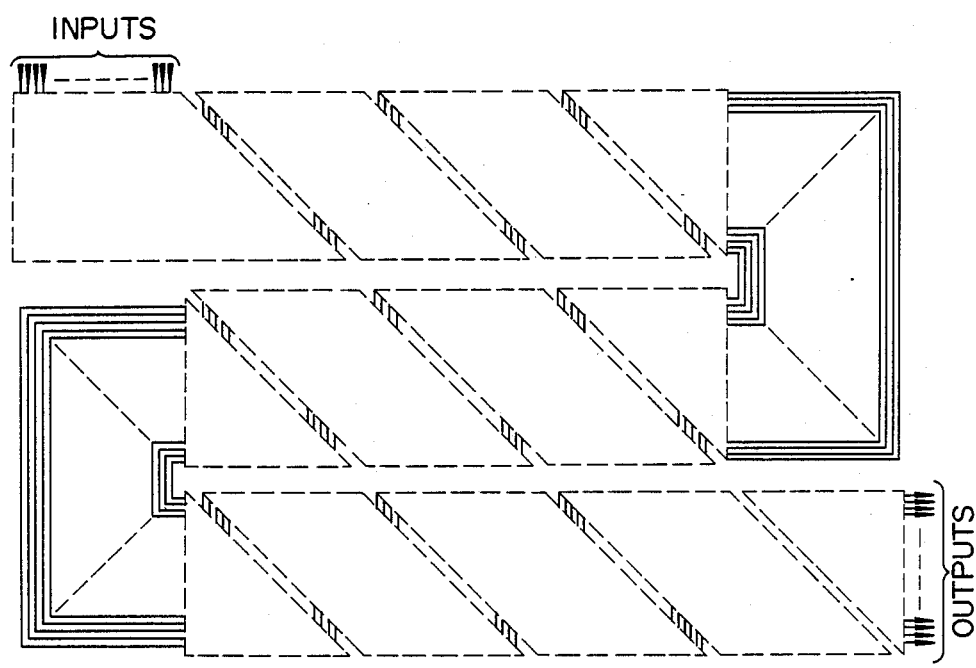
FIG. 9 shows a one-chip layout of diagonal array logic circuits, with a number of gates.

When the number of gates is increased, the length of the diagonal area becomes much greater than the width thereof. Therefore, even when modified as shown in FIG. 6, the matrix array ill have an elongated rectangular shape. For example, in the case of 5,000 gates, the length is 5,000 and the width is approximately 230 (4.6%) as seen from FIG. 7. For re-forming this configuration into a square shape suitable for the LSI fabrication, the rectangular matrix array may be folded as shown in FIG. 9.

In the arrangement of FIG. 5, input and output terminals of the matrix logic circuit are provided on the left upper side and on the right lower side, respectively. In the case of FIGS. 6 and 8, they are provided on the right and left sides. However, these terminals may be provided at any location. When the limitation for the position of the terminals is removed, a circuit may be formed in a narrower diagonal area, improving an integration density.

In the embodiments as mentioned above, the size and layout of a diagonal logic array are determined exclusively for each circuit. Alternatively, a general-purpose programmable logic array may be formed in the following manners.

(a) A transistor is previously connected at each intersection of a matrix to an input or output line through a fuse. After the LSI is manufactured, the fuse may be cut out as required. This is the technique used in PROM and FPLA.

(b) The effective intersections are disposed on both sides of direct connection points so that sequence logic circuits may be formed.

(c) The width of the diagonal area is formed to be slightly larger than that as given by equation (1), allowing a margin for circuit modification.

The LSI fabricated in the above-mentioned manners can provide by selectively melting fuses any logic circuit network within a range of the number of gate fabricated therein. In the type of LSI where the combination of a transistor and a fuse in the programmable diagonal logic array is replaced by, for example, a MOS transistor having a floating gate, the pattern of the effective intersections may be changed if necessary, as in the case of an EPROM.

As shown in FIG. 10A, a transistor may be provided at each intersection so that the transistor is selectively set in a conductive or non-conductive state by a flip-flop. This arrangement provides variable logic array capable of dynamically changing a function of the logic circuit. In the example of FIG. 10A the variable logic array is shown in the form of an rectangular array but may be adapted for the diagonal array.

In the embodiment of FIG. 10A, connected in series with a transistor T1 acting as a connecting element is a transistor T2 which is controlled by a flip-flop F. Flip-flop F may be a type-D flip-flop which has its T input connected to a clock line Cn supplied with a clock pulse and its D input connected to a data line Dn supplied with data of "1" or "0". Output Q of flip-flop F which is connected to the gate of transistor T2 goes to a logic 1 level or logic 0 level depending on input data when a clock pulse is applied. When output Q of flip-flop F is at logic 0 level transistor T2 is nonconductive and thus transistor T1 is rendered in nonconducting state. When the output Q of flip-flop F is at logic 1 level transistor T2 is conducting so that transistor T1 is rendered in connecting state.

When sequential clock pulses are applied to clock line C1 to C6 provided in parallel with input lines and desired data is applied to data lines D1 to D5, desired transistors T1 can be set in connecting state.

Figure 10B:
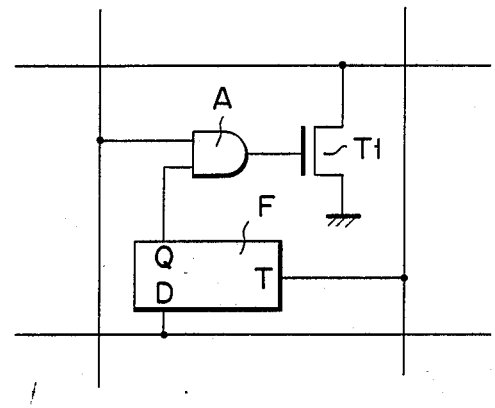

For example, to realize the circuit of FIG. 2B, it is initially required that, immediately before clock pulses are sequentially applied to the respective clock lines, binary data "10100", "01100", "00010", "00010", "00001" and "00001" be applied to data lines D1 to D5. In the embodiment of FIG. 10B, flip-flop F controls AND gate A connected between the gate of transistor T1 and an input line.

The diagonal variable array logic circuits may be used in realizing a computer or hardware with good flexibility and adaptability. Further, the diagonal variable array logic circuits of the present invention may be used as a general-purpose logic simulator or a variable hardware breadboard. When the logic circuit is used as the general-purpose logic simulator, a real-time simulation may be performed since all logic circuits to be simulated are simulated in parallel. Moreover, the variable logic array may be used in combination with external devices for checking the operation thereof, leading to a remarkable reduction of a period of time to develop LSIs.

The rearrangement of the matrix is performed according to the following algorithm.

An alternate sort algorithm based on the positions of midpoints of the matrix, as an example, will be described with respect to an algorithm for the diagonal version of a sparse matrix (also called a band-width reduction). The alternate sort algorithm is featured by a small amount of calculation, and simple and quick diagonal version of the matrix array.

Assume now that the row and column lines of a matrix are sequentially numbered from the upper left corner of the matrix. In this sort algorithm, the row and column sortings are alternately performed until the variations in the row and column weights do not change.

Row Sorting (1a) Calculate the row weight of every row in the following manner.
Row weight=½ (the column number of a nonzero element at the leftmost position of the row +the column number of a nonzero element at the rightmost position of the row),
where the nonzero element indicates an effective intersection or a direct connection point.
(1b) Rearrange the rows in the order of increasing weight starting from the top row.

Column Sorting (2a) Calculate tee column weight of every column in the following manner.
Column weight =½ (the row number of a nonzero element at the uppermost position of the column+ the row number of a nonzero element at the lower most position of the column)
(2b) Rearrange the columns in the order of increasing order starting from the leftmost column.

Figure 11:
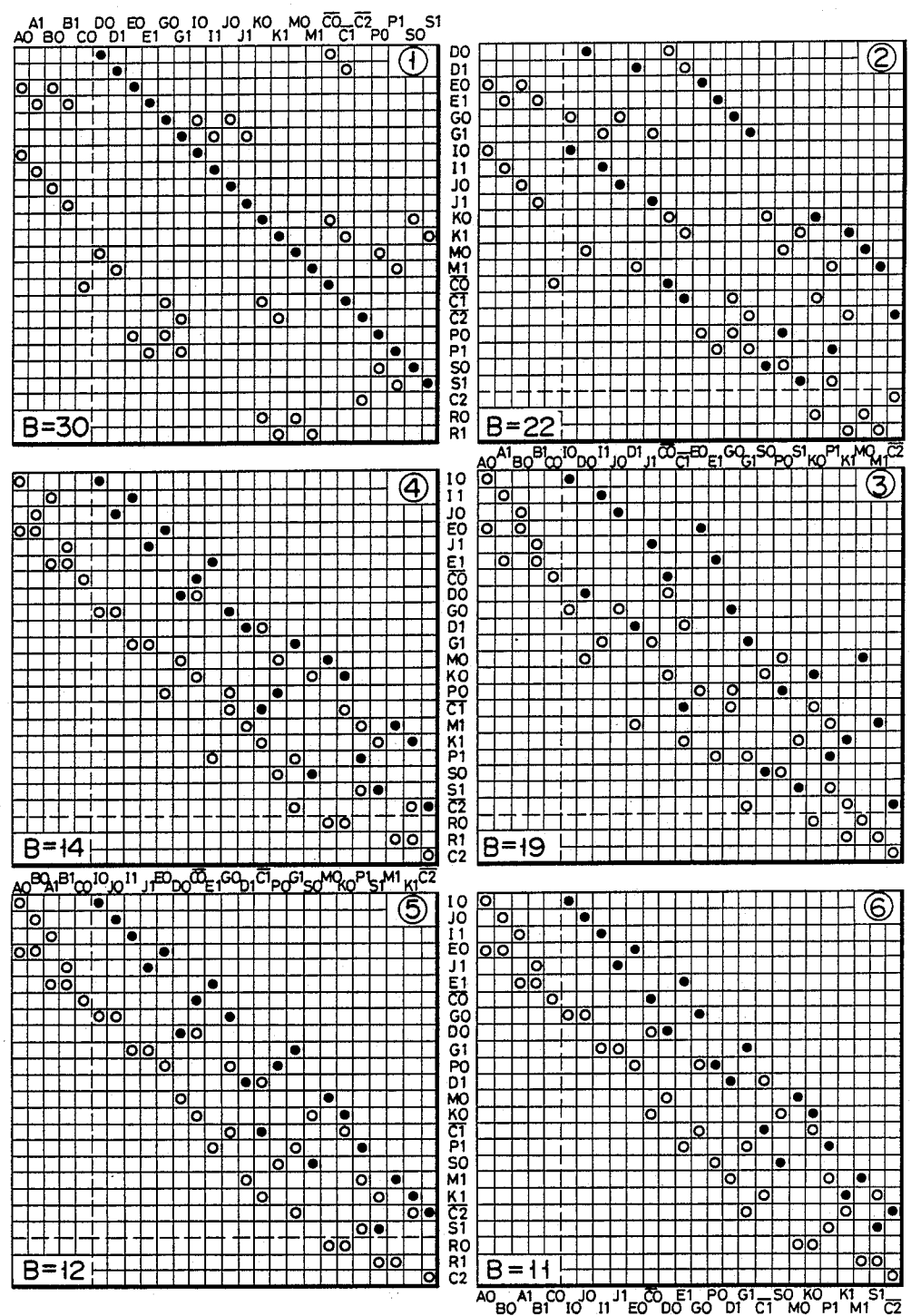
FIG. 11 illustrates a process of rearranging input and output lines of a matrix circuit using a sort algorithm.

FIG. 11 shows a process of rearranging the matrix of FIG. 4C, using the sort algorithm as mentioned above. The column sorting①, the row sorting ② ... are successively performed. As seen from FIG. 11, the effective intersections are rapidly gathered into a diagonal area. The algorithm is adapted so that the input terminals are located to the left upper portion and the output terminals at the right lower portion.

What is claimed is:
1. A matrix logic circuit network comprising:
   a plurality of logic gates having input and output lines and active elements, said plurality of logic gates being arranged such that an output line of one logic gate is connected to an input line of another succeeding logic gate, and said input and output lines of said logic gates being arranged respectively as a matrix array of column lines and row lines; and
   direct connection points at which corresponding input and output lines, to which an identical signal is applied, are directly connected to each other at intersections of said input and output lines within said matrix array so that an output line of one logic gate is directly connected to an input line of another succeeding logic gate of said logic gates;
   said active elements being arranged at given intersections of said input and output lines of said matrix array to form said logic gates;
   said input and output lines of said matrix array, said direct connection points and said active elements being arranged solely within a diagonal area smaller than the entire matrix having a given width which extends along a diagonal line of said matrix array;
   said diagonal area being divided into a plurality of sub-areas in parallel with a first one of said input and output lines.

2. A matrix logic circuit network according to claim 1 characterized in that said logic gates each have a NAND/NOR function.

3. A matrix circuit network according to claim 1, in which said sub-areas are arranged side-by-side to partially overlap one another with respect to a second one of said input and output lines.

4. A matrix logic circuit network according to claim 3 characterized in that first and second lines are said output and input lines of said logic gates, respectively.

5. A matrix logic circuit network according to claim 1 characterized in that said connecting elements are MOS transistors.

6. A matrix logic circuit network according claim 1 characterized in that said connecting elements are bipolar transistors.

7. A matrix logic circuit network according to claim 1 characterized in that said connecting elements are provided at the respective intersections of said input and output lines, and circuit means is provided for selectively setting said connecting means in an electrical connection state.

8. A matrix logic circuit network comprising:
a plurality of logic gates having input and output lines and active elements, said plurality of logic gates being arranged each that an output line of one logic gate is connected to an input line of another succeeding logic gate, and said input and output lines of said logic gates being arranged respectively as a matrix array of column lines and row line; and
direct connection points at which corresponding input and output lines, to which an identical signal is applied, are directly connected to each other within said matrix array so that an output line of one logic gate is directly connected to an input line of another succeeding logic gate o said logic gates;
said active elements being arranged at given intersections of said input and output lines of said matrix array to form said logic gates;
said direct connection points and said active elements being arranged solely within a diagonal area smaller than the entire matrix extending along a diagonal line of said matrix array, said diagonal area being divided into a plurality of sub-areas in parallel with a first one of said input and output lines, and said sub-areas being arranged side-by-side to partially overlap one another with respect to a second one of said input and output lines.

* * * * *